United States Patent
McFeely et al.

(10) Patent No.: US 8,661,664 B2
(45) Date of Patent: Mar. 4, 2014

(54) TECHNIQUES FOR FORMING NARROW COPPER FILLED VIAS HAVING IMPROVED CONDUCTIVITY

(75) Inventors: Fenton Read McFeely, Ossining, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 587 days.

(21) Appl. No.: 12/838,597

(22) Filed: Jul. 19, 2010

(65) Prior Publication Data
US 2012/0012372 A1   Jan. 19, 2012

(51) Int. Cl.
*H01K 3/10* (2006.01)

(52) U.S. Cl.
USPC ............... 29/852; 29/830; 257/751; 438/627; 438/643

(58) Field of Classification Search
USPC ................ 29/830, 846, 851, 852; 174/257; 216/18; 257/751, 767, 774; 438/625, 438/627, 643, 650, 679, 686, 687
See application file for complete search history.

(56) References Cited

U.S. PATENT DOCUMENTS

| | | | |
|---|---|---|---|
| 6,368,967 B1 | 4/2002 | Besser | |
| 7,074,719 B2 | 7/2006 | Kim et al. | |
| 7,244,677 B2 | 7/2007 | Ritzdorf et al. | |
| 7,253,103 B2 | 8/2007 | Iwasaki et al. | |
| 7,265,048 B2 | 9/2007 | Chung et al. | |
| 7,449,409 B2 * | 11/2008 | Barth et al. | 438/627 |
| 7,452,812 B2 | 11/2008 | Beyer et al. | |
| 7,923,839 B2 * | 4/2011 | Kitamura et al. | 257/767 |
| 2006/0113675 A1 | 6/2006 | Chang et al. | |
| 2006/0202345 A1 | 9/2006 | Barth et al. | |
| 2008/0206982 A1 | 8/2008 | Suzuki | |
| 2008/0242088 A1 | 10/2008 | Suzuki | |
| 2008/0296768 A1 | 12/2008 | Chebiam et al. | |
| 2009/0130843 A1 | 5/2009 | Suzuki | |
| 2009/0226611 A1 | 9/2009 | Suzuki et al. | |
| 2009/0321933 A1 | 12/2009 | McFeely et al. | |
| 2010/0084766 A1 | 4/2010 | Yang et al. | |

OTHER PUBLICATIONS

Wang et al., "Low-Temperature Chemical Vapor Deposition and Scaling Limit of Ultrathin Ru Films," Applied Physics Letters, vol. 84, No. 8, pp. 1380-1382 (2004).

* cited by examiner

*Primary Examiner* — Donghai D. Nguyen
(74) *Attorney, Agent, or Firm* — Vazken Alexanian; Michael J. Chang, LLC

(57) ABSTRACT

Techniques for improving the conductivity of copper (Cu)-filled vias are provided. In one aspect, a method of fabricating a Cu-filled via is provided. The method includes the following steps. A via is etched in a dielectric. The via is lined with a diffusion barrier. A thin ruthenium (Ru) layer is conformally deposited onto the diffusion barrier. A thin seed Cu layer is deposited on the Ru layer. A first anneal is performed to increase a grain size of the seed Cu layer. The via is filled with additional Cu. A second anneal is performed to increase the grain size of the additional Cu.

22 Claims, 2 Drawing Sheets

TECHNIQUES FOR FORMING NARROW COPPER FILLED VIAS HAVING IMPROVED CONDUCTIVITY

FIELD OF THE INVENTION

The present invention relates to wiring structures and more particularly, to techniques for improving conductivity of copper (Cu)-filled vias.

BACKGROUND OF THE INVENTION

The conductivity of narrow copper (Cu)-filled vias in current high density wiring technology is degraded by the small grain size of the Cu in vias of these dimensions. Conventional techniques involve annealing the Cu-containing structure to grow the grain size and thus improve the conductivity.

For example, in general, conventional techniques used for fabricating a Cu-filled via typically involve first forming a via hole in a dielectric matrix in which the wiring structure is embedded. Second, the via hole is lined with a diffusion barrier to prevent the diffusion of Cu into the dielectric. This diffusion barrier typically includes tantalum nitride (TaN) deposited directly onto the dielectric, and tantalum (Ta) deposited on top of the TaN. Third, a thin layer of seed Cu is sputter deposited onto the exposed Ta surface, in order to prepare the via for electroplating. Fourth, an electroplating process is used to fill the via with Cu. Fifth, the resulting structure is annealed to grow the Cu grains in the via and improve the conductivity. This approach, however, has proven to be of limited effectiveness for these Cu via structures in terms of enhancing conductivity.

A limiting factor for the growth of large Cu grains is the size of the grains in the seed Cu layer. These grains in the seed Cu form a template upon which the electroplated Cu is subsequently deposited, and the grain size of the initially electroplated Cu thus reflects the small grain size exhibited by the seed Cu layer. Annealing subsequent to Cu electroplating is of only limited effectiveness in overcoming the initial small grain structure. The small grain size exhibited by the seed Cu layer is in great part the result of the thinness of this layer, along with the degree to which the Cu wets the underlying diffusion barrier surface. The seed Cu layer thickness cannot be increased to overcome this problem because the seed Cu, being formed by a sputtering process, is not deposited conformally. Thus if the seed Cu is made too thick in an attempt to increase its grain size, it will tend to pinch off the openings to the via in the wiring structure, rendering subsequent successful electroplating impossible.

Therefore, techniques for improving the conductivity of Cu-filled vias would be desirable.

SUMMARY OF THE INVENTION

The present invention provides techniques for improving the conductivity of copper (Cu)-filled vias. In one aspect of the invention, a method of fabricating a Cu-filled via is provided. The method includes the following steps. A via is etched in a dielectric. The via is lined with a diffusion barrier. A thin ruthenium (Ru) layer is conformally deposited onto the diffusion barrier. A thin seed Cu layer is deposited on the Ru layer. A first anneal is performed to increase a grain size of the seed Cu layer. The via is filled with additional Cu. A second anneal is performed to increase the grain size of the additional Cu.

In another aspect of the invention, a Cu-filled via formed in a dielectric is provided which includes a via, a diffusion barrier lining the via, a thin Ru layer disposed conformally on the diffusion barrier, a thin seed Cu layer disposed on the Ru layer and additional Cu plated onto the thin seed Cu layer filling the via to form the Cu-filled via. The additional copper has an average grain width of at least 0.5 times a width of the via. The width of the via can be from about 20 nanometers to about 50 nanometers.

A more complete understanding of the present invention, as well as further features and advantages of the present invention, will be obtained by reference to the following detailed description and drawings.

DETAILED DESCRIPTION OF PREFERRED EMBODIMENTS

FIGS. 1-5 are diagrams illustrating an exemplary methodology for fabricating a copper (Cu)-filled via. Advantageously, Cu-filled vias formed using the present techniques show a consistent 10-15% decrease in resistance as compared to structures produced using conventional techniques. To begin the process, a dielectric is formed over a substrate.

Figure 1:
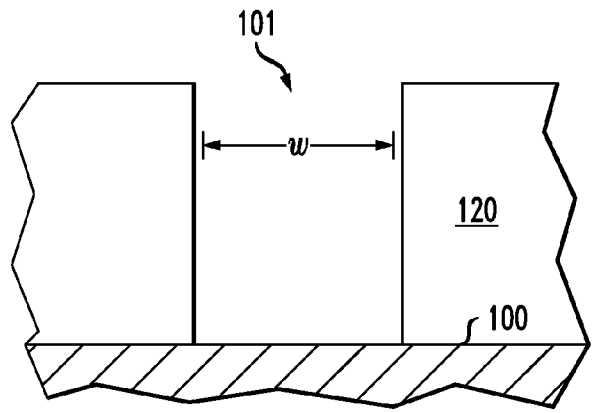
FIG. 1 is a cross-sectional diagram illustrating a dielectric having been deposited over a substrate and a via etched into the dielectric according to an embodiment of the present invention.

FIG. 1 is a cross-sectional diagram illustrating a dielectric 120 having been deposited over a substrate 100. Dielectric 120 can comprise any suitable dielectric material, including, but not limited to, one or more of silicon dioxide ($SiO_2$), silicon-carbon-oxygen-hydrogen materials (e.g., SICOH) and organic polymers, and can be deposited using any suitable deposition process, such as chemical vapor deposition (CVD), atomic layer deposition (ALD), evaporation, sputtering or solution based techniques, such as spin-on coating, to a thickness of from about 10 nanometers (nm) to about 1,000 nm. Substrate 100 generally represents any wiring or contact layer in a single or multilayer wiring array. A narrow via 101 is then etched into dielectric 120, using any suitable etching process, such as reactive ion etching (RIE). According to the exemplary embodiment shown in FIG. 1, via 101 is formed having a width w of from about 20 nm to about 50 nm.

Figure 2:
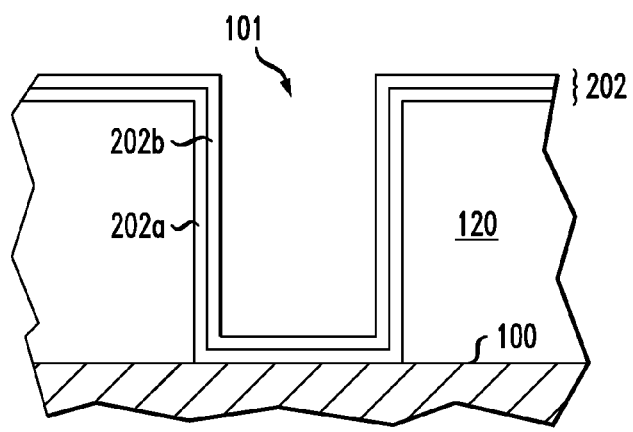
FIG. 2 is a cross-sectional diagram illustrating the via having been lined with a diffusion barrier according to an embodiment of the present invention.

Next, the via is lined with a diffusion barrier. FIG. 2 is a cross-sectional diagram illustrating via 101 having been lined with a diffusion barrier 202. According to an exemplary embodiment, diffusion barrier 202 is made up of two layers. The first layer, a tantalum nitride (TaN) layer 202a, is deposited onto dielectric 120, to a thickness of from about 5 nm to about 15 nm, e.g., from about 8 nm to about 12 nm, so as to line the via. The second layer, a tantalum (Ta) layer 202b, is deposited onto TaN layer 202a to a thickness of from about 5 nm to about 15 nm, e.g., from about 8 nm to about 12 nm. Diffusion barrier 202 prevents the diffusion of Cu (see below) into the dielectric.

Figure 3:
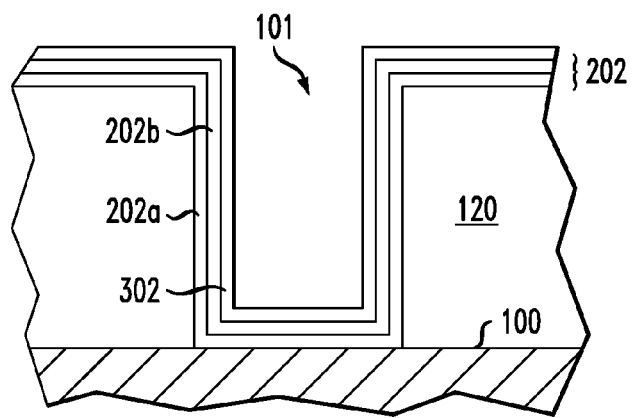
FIG. 3 is a cross-sectional diagram illustrating a ruthenium (Ru) layer having been deposited onto the diffusion barrier according to an embodiment of the present invention.

A thin ruthenium (Ru) layer is then conformally deposited onto the diffusion barrier. FIG. 3 is a cross-sectional diagram illustrating Ru layer 302 having been deposited onto diffusion barrier 202 (i.e., onto Ta layer 202b). According to an exemplary embodiment, Ru layer 302 is conformally deposited onto diffusion barrier 202 to a thickness of from about 1 nm to about 10 nm, e.g., from about 2 nm to about 5 nm using CVD or ALD with ruthenium carbonyl as a precursor. CVD or ALD ensures uniform conformal coverage of the Ru on the diffusion barrier (it is undesirable to have any Ta from the diffusion barrier exposed during the subsequent steps of the process). Alternatively, Ru layer 302 can be deposited onto diffusion barrier 202 using a sputter deposition process.

Ru layer 302 serves two purposes. First Ru layer 302 acts as a wetting agent for a seed Cu layer (see below), to facilitate the formation of larger seed grains. Second Ru layer 302 acts to protect the underlying diffusion barrier 202 from oxidation during an anneal step used to increase the grain size of the seed Cu layer (see also below). Accordingly, uniform coverage by the Ru is important.

Figure 4:
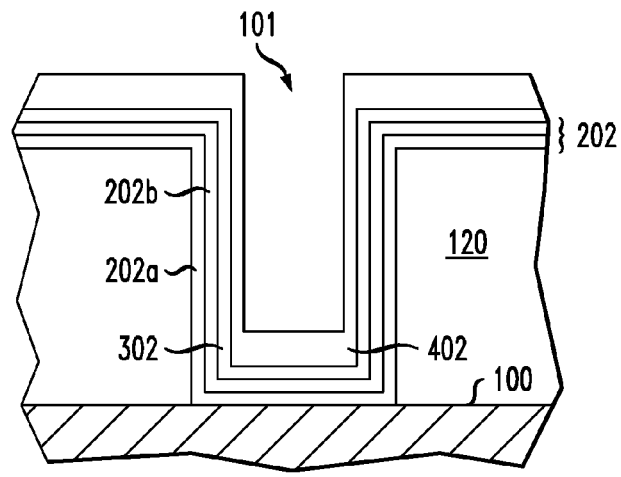
FIG. 4 is a cross-sectional diagram illustrating a seed copper (Cu) layer having been deposited on the Ru layer to prepare the via for electroplating according to an embodiment of the present invention.

A thin seed Cu layer is deposited on the Ru layer. FIG. 4 is a cross-sectional diagram illustrating seed Cu layer 402 having been deposited on Ru layer 302 in order to prepare the via for electroplating. According to an exemplary embodiment, seed Cu layer 402 is deposited on Ru layer 302 to a thickness of from about 20 nm to about 100 nm, e.g., from about 25 nm to about 35 nm, using a sputter deposition process.

An anneal is then performed to increase the grain size of seed Cu layer 402. According to an exemplary embodiment, the anneal is performed at a temperature of from about 150 degrees Celsius (° C.) to about 350° C., e.g., about 250° C., in forming gas (e.g., hydrogen or a mixture of hydrogen with any gas with which the substrate would not react, e.g., nitrogen or a noble gas). It is notable that this step of annealing the seed Cu layer is performed before the electroplating used to fill the via (see below). This produces larger seed grains which promotes the formation of larger grains in the via after the electrochemical Cu fill. Further, without the introduction of Ru layer 302 this seed Cu layer anneal would not be effective for two reasons. First, the seed Cu layer would be deposed upon a Ta surface (of the diffusion barrier), which is poorly wetted by the Cu. The anneal would thus cause the seed Cu layer to ball up, not form the uniform flat grains desired. Second, owing to the lack of continuity of the seed Cu layer on the Ta layer (of the diffusion barrier), the exposed Ta would oxidize (unless the anneal was performed in an ultrahigh vacuum environment, which would be prohibitively expensive). The oxidation of the Ta would degrade the electromigration performance of the structure. Owing to the high degree of chemical affinity of Ta for oxygen, it would not be practical to attempt to restore any Ta, once oxidized, to the metallic state by a subsequent reduction process. By covering the Ta with a uniform conformal Ru layer, an oxidation resistant noble metal, this problem is avoided in the proposed structure.

Figure 5:
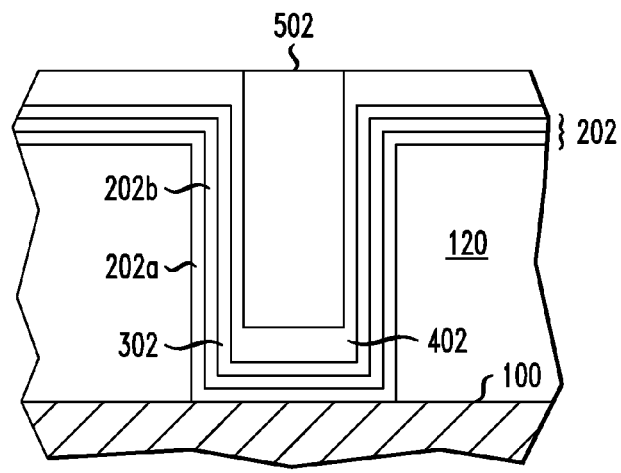
FIG. 5 is a cross-sectional diagram illustrating the via having been filled with Cu according to an embodiment of the present invention.

The via is then filled with additional Cu. FIG. 5 is a cross-sectional diagram illustrating via 101 having been filled with Cu 502. According to an exemplary embodiment, Cu 502 is plated into via 101 using an electroplating process. As shown in FIG. 5, Cu 502 which will likely overfill the via can be polished down to be coplanar with the top surface of seed Cu layer 402, if desired. The Cu 502 overfill can, alternatively, be left covering the top surface of seed Cu layer 402. See, for example, FIG. 6, described below. An anneal is again performed, this time to increase the grain size of Cu 502. According to an exemplary embodiment, the anneal is performed at a temperature of from about 150° C. to about 350° C., e.g., about 250° C., in a forming gas.

By increasing the grain size of Cu 502, the conductivity of the via is also increased. Namely, vias formed by the present techniques in a test showed a consistent 10-15% decrease in resistance as compared to conventionally prepared structures. In the test, the present structures and the conventional structures were furthermore both subjected to further thermal cycling treatments to simulate the fabrication of six subsequent wiring layers. After such treatment, the 10% to 15% performance advantage of the present structures was maintained.

Figure 6:
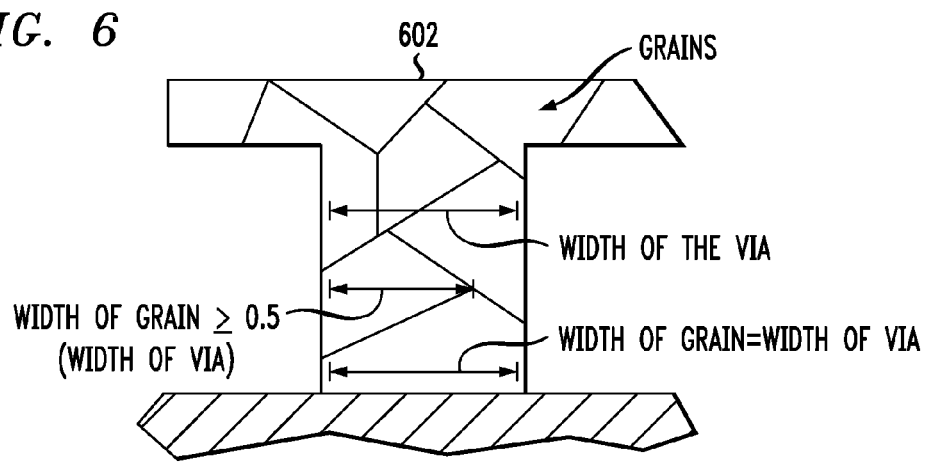
FIG. 6 is a cross-sectional diagram illustrating a Cu-filled via produced using the present techniques according to an embodiment of the present invention.

Increasing the grain size of the seed Cu layer promotes the formation of larger grains in the via after the electrochemical Cu fill. This advantage of the present techniques is shown illustrated schematically in FIG. 6. FIG. 6 is a cross-sectional diagram illustrating a Cu-filled via produced using the above-described fabrication process. Cu 602 is representative of the additional Cu filled into the via, e.g., as per the step described in conjunction with the description of FIG. 5, above. The various layers deposited before the Cu fill, e.g., the diffusion barrier, Ru layer and seed Cu layer (see, for example, FIG. 5, described above), are not shown for ease and clarity of depiction, however it is to be understood that these layers are present in this example. Further, by way of contrast to Cu 502 of FIG. 5, the additional Cu fill in FIG. 6, i.e., Cu 602, overfills the via. As highlighted above, an optional polishing step can be employed to remove the overfill if desired.

FIG. 6 is provided to highlight the beneficial grain characteristics of the instant techniques. Specifically, by first growing the grain size of the seed Cu layer, see above, larger, more uniform grains are achieved in the via after the additional Cu fill and final anneal, see also above. By way of example only, the grain size g attained in Cu 602 is at least about 0.5 times the feature size. Grain size g can be quantified as a linear dimension measured as a cross-sectional width of the grain (see FIG. 6). Feature size can be quantified as a cross-sectional width of the feature (the via in this example) (see FIG. 1). Thus in this case, on average, the grains of the additional Cu 602 (post final anneal) have a cross-sectional width that is at least 0.5 times the cross-sectional width of the via. It is possible with the present techniques to attain grains in the additional Cu fill that have a cross-sectional width that is equal to the cross-sectional width of the via. See FIG. 6.

It is also notable that the grain size is fairly uniform in the present structures. By way of example only, the grain size (measured, e.g., based on cross-sectional grain width as described above) does not vary by more than 25 percent throughout the via.

By comparison, with conventional techniques non-uniform grain sizes would be produced throughout the via, with larger grains being produced on top and smaller grains being produced on the bottom of the via (where the Cu is more spatially confined). The cross-sectional width of these smaller grains is typically about 0.2 times the cross-sectional width of the via, an order of magnitude smaller than is produced with the instant techniques.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for fabricating a copper-filled via, comprising the steps of:
   etching a via in a dielectric;
   lining the via with a diffusion barrier comprising tantalum;
   conformally depositing a thin ruthenium layer onto the diffusion barrier in a manner by which uniform coverage of the ruthenium layer on the diffusion barrier is achieved preventing exposure and oxidation of any tantalum from the diffusion barrier and thus preventing oxidation of the diffusion barrier;
   depositing a thin seed copper layer on the ruthenium layer;
   performing a first anneal to increase a grain size of the seed copper layer, wherein the first anneal is performed in a forming gas comprising hydrogen;
   filling the via with additional copper; and
   performing a second anneal to increase the grain size of the additional copper,
   wherein following the second anneal the additional copper has an average cross-sectional grain width of at least 0.5 times a cross-sectional width of the via.

2. The method of claim 1, wherein the step of lining the via with the diffusion barrier comprises the steps of:
   depositing a tantalum nitride layer onto the dielectric so as to line the via; and
   depositing a tantalum layer onto the tantalum nitride layer.

3. The method of claim 2, wherein the tantalum nitride layer is deposited to a thickness of from about 5 nanometers to about 15 nanometers.

4. The method of claim 2, wherein the tantalum nitride layer is deposited to a thickness of from about 8 nanometers to about 12 nanometers.

5. The method of claim 2, wherein the tantalum layer is deposited to a thickness of from about 5 nanometers to about 15 nanometers.

6. The method of claim 2, wherein the tantalum layer is deposited to a thickness of from about 8 nanometers to about 12 nanometers.

7. The method of claim 1, wherein the ruthenium layer is deposited to a thickness of from about 1 nanometer to about 10 nanometers.

8. The method of claim 1, wherein the ruthenium layer is deposited to a thickness of from about 2 nanometers to about 5 nanometers.

9. The method of claim 1, wherein the ruthenium layer is deposited onto the diffusion barrier using chemical vapor deposition.

10. The method of claim 9, wherein ruthenium carbonyl is used as a precursor for the chemical vapor deposition.

11. The method of claim 1, wherein the ruthenium layer is deposited onto the diffusion barrier using atomic layer deposition.

12. The method of claim 11, wherein ruthenium carbonyl is used as a precursor for the atomic layer deposition.

13. The method of claim 1, wherein the ruthenium layer is deposited onto the diffusion barrier using a sputter deposition process.

14. The method of claim 1, wherein the seed copper layer is deposited to a thickness of from about 20 nanometers to about 100 nanometers.

15. The method of claim 1, wherein the seed copper layer is deposited to a thickness of from about 25 nanometers to about 35 nanometers.

16. The method of claim 1, wherein the seed copper layer is deposited using a sputter deposition process.

17. The method of claim 1, wherein the first anneal is performed at a temperature of from about 150° C. to about 350° C. in the forming gas.

18. The method of claim 1, further comprising the step of:
   plating the additional copper into the via.

19. The method of claim 18, wherein the additional copper is electroplated into the via.

20. The method of claim 1, wherein the second anneal is performed at a temperature of from about 150° C. to about 350° C. in forming gas.

21. The method of claim 1, wherein the cross-sectional width of the via is from about 20 nanometers to about 50 nanometers.

22. The method of claim 1, wherein the grain size of the additional copper varies by no more than 25 percent throughout the via.

* * * * *